US 9,306,109 B2

(12) United States Patent
Sano et al.

(10) Patent No.: US 9,306,109 B2
(45) Date of Patent: Apr. 5, 2016

(54) SEMICONDUCTOR DEVICE MANUFACTURING METHOD

(71) Applicant: CANON KABUSHIKI KAISHA, Tokyo (JP)

(72) Inventors: Hiroaki Sano, Chofu (JP); Takashi Usui, Ashigarakami-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/742,952

(22) Filed: Jun. 18, 2015

(65) Prior Publication Data

US 2015/0380595 A1 Dec. 31, 2015

(30) Foreign Application Priority Data

Jun. 25, 2014 (JP) .................................. 2014-130686

(51) Int. Cl.
*H01L 21/00* (2006.01)
*H01L 31/18* (2006.01)
*H01L 27/146* (2006.01)

(52) U.S. Cl.
CPC .......... *H01L 31/18* (2013.01); *H01L 27/14689* (2013.01)

(58) Field of Classification Search
CPC . H01L 21/32139; H01L 21/266; H01L 31/18; H01L 27/14689
See application file for complete search history.

(56) References Cited

U.S. PATENT DOCUMENTS

| 5,605,601 A * | 2/1997 | Kawasaki | ......... H01L 21/32135 257/E21.31 |
| 2003/0134472 A1* | 7/2003 | Yang | ................. H01L 21/02071 438/257 |
| 2012/0244694 A1* | 9/2012 | Shinohara | ............. H01L 27/105 438/591 |

FOREIGN PATENT DOCUMENTS

| JP | 6-275574 A | 9/1994 |
| JP | 8-274325 A | 10/1996 |
| JP | 10-50840 A | 2/1998 |
| JP | 2006-073611 A | 3/2006 |
| JP | 2009-060026 A | 3/2009 |

* cited by examiner

*Primary Examiner* — Bradley K Smith
(74) *Attorney, Agent, or Firm* — Fitzpatrick, Cella, Harper & Scinto

(57) ABSTRACT

A semiconductor device manufacturing method is provided. The method includes forming a first, second and third films, forming a first mask pattern on the third film, forming a gate electrode by using the first mask pattern, forming a second mask pattern having an opening above a portion of the first mask pattern and a region adjacent to the gate electrode, and performing ion implantation by using the first and second mask patterns. The gate electrode formation includes etching the third film, etching the second film and overetching the second film by using a first, second and third processing gases. A first, second and third depositions formed on the sidewalls of the gate electrode in the third and second films etching and overetching, contain at least one of chlorine or bromine and do not contain fluorine.

20 Claims, 3 Drawing Sheets

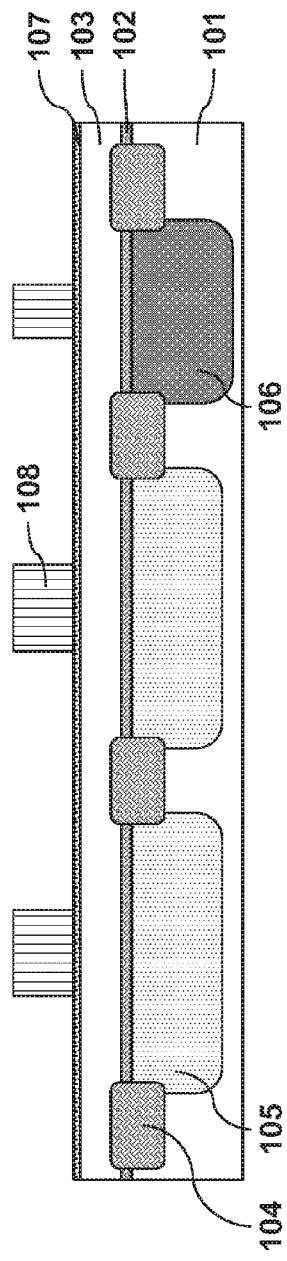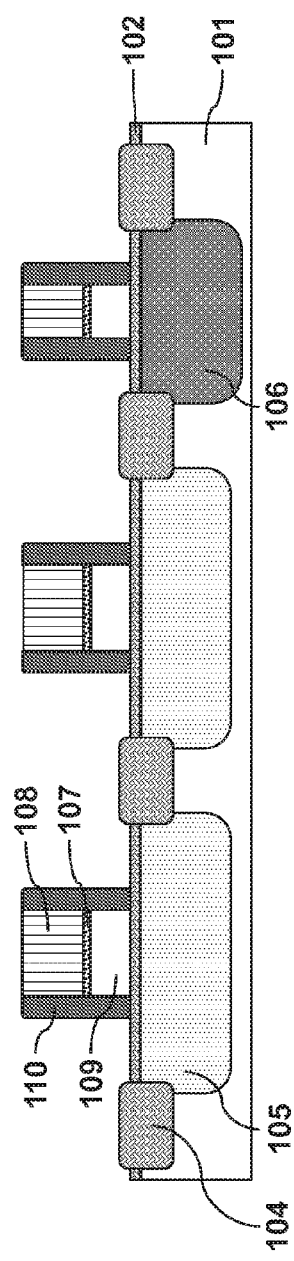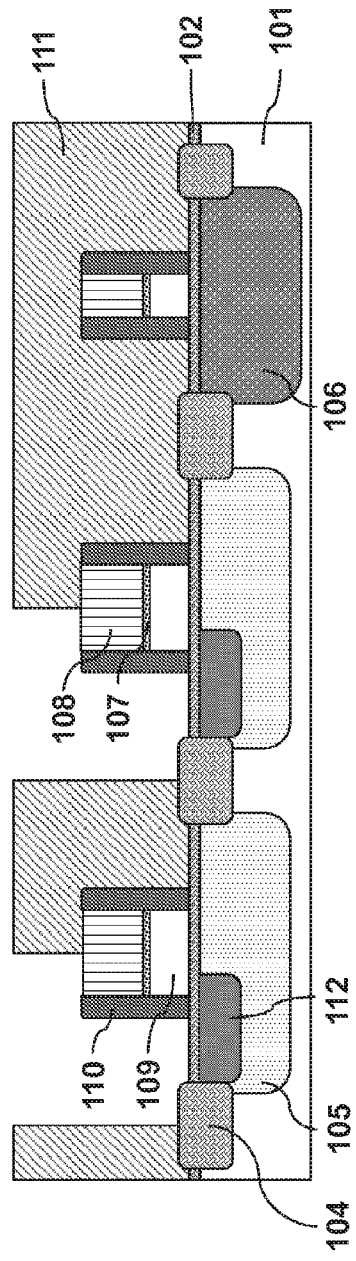

F I G. 3

|  | ANTIREFLECTION FILM ETCHING | POLYSILICON FILM ETCHING | POLYSILICON FILM OVERETCHING |
|---|---|---|---|
| EXAMPLE | $Cl_2/O_2$ | $Cl_2/HBr/O_2$ | $Cl_2/HBr/O_2$ |
| PROCESSING GAS EXAMPLE 1 | $CF_4$ | $CF_4$ | $CF_4$ |
| PROCESSING GAS EXAMPLE 2 | $Cl_2/HBr/O_2$ | $Cl_2/HBr/O_2$ | $Cl_2/HBr/O_2$ |
| PROCESSING GAS EXAMPLE 3 | $HBr/O_2$ | $HBr/O_2/He$ | $HBr/O_2/He$ |
| PROCESSING GAS EXAMPLE 4 | $Cl_2/O_2$ | $Cl_2/O_2$ | $Cl_2/O_2$ |
| PROCESSING GAS EXAMPLE 5 | $HBr/O_2$ | $HBr/O_2$ | $HBr/O_2$ |

SEMICONDUCTOR DEVICE MANUFACTURING METHOD

BACKGROUND OF THE INVENTION

1. Field of the Invention

The present invention relates to a semiconductor device manufacturing method.

2. Description of the Related Art

Japanese Patent Laid-Open No. 2006-73611 describes a method of forming a charge accumulation layer of a photodiode in a position adjacent to a gate electrode by self alignment. In this method, a gate electrode is first formed by using a first mask pattern. Then, a second mask pattern is formed without removing the first mask pattern used in the formation of the gate electrode. Ion implantation is performed in a region defined by a common portion of the position of an opening of the first mask pattern and the position of an opening of the second mask pattern, thereby forming a charge accumulation layer of a photodiode. The charge accumulation layer of the photodiode is defined by the first and second mask patterns, and formed in a position adjacent to the gate electrode by self alignment.

SUMMARY OF THE INVENTION

In the etching step of forming the gate electrode by using the first mask pattern, a deposition may be formed on the sidewalls of the gate electrode. The present inventors have found that this deposition is sometimes detached by a developing process when forming the second mask pattern after the formation of the gate electrode. This detachment of the deposition from the gate electrode includes detachment of the whole deposition from the gate electrode, and detachment of a part of the deposition from the rest of the deposition. When ion implantation is performed after the formation of the second mask pattern, if the deposition detached from the sidewalls of the gate electrode adheres to the openings of the first and second mask patterns, the adhered deposition varies the ion implantation dose. Consequently, the characteristic of the photodiode formed by ion implantation varies from one pixel to another, and this decreases the yield. An embodiment of the present invention provides a technique for improving the adhesion of a deposition covering the sidewalls of a gate electrode when the gate electrode is formed.

According to some embodiments, a semiconductor device manufacturing method comprising: forming a first film, a second film, and a third film in this order on a semiconductor substrate; forming a first mask pattern on the third film; forming a gate electrode by using the first mask pattern; forming a second mask pattern having an opening above a portion of the first mask pattern and a region adjacent to the gate electrode; and performing ion implantation on the semiconductor substrate by using the first mask pattern and the second mask pattern as masks, wherein forming the gate electrode includes etching the third film by using a first processing gas, etching the second film by using a second processing gas, and overetching the second film by using a third processing gas, and a first deposition formed on sidewalls of the gate electrode in the etching of the third film, a second deposition formed on the sidewalls of the gate electrode in the etching of the second film, and a third deposition formed on the sidewalls of the gate electrode in the overetching contain at least one of a chlorine atom or a bromine atom and do not contain a fluorine atom, is provided.

According to some other embodiments, a semiconductor device manufacturing method comprising: forming a first film, a second film, and a third film in this order on a semiconductor substrate; forming a first mask pattern on the third film; forming a gate electrode by using the first mask pattern; forming a second mask pattern having an opening above a portion of the first mask pattern and a region adjacent to the gate electrode; and performing ion implantation on the semiconductor substrate by using the first mask pattern and the second mask pattern as masks, wherein forming the gate electrode includes etching the third film by using a first processing gas, etching the second film by using a second processing gas, and overetching the second film by using a third processing gas, and a first deposition formed on sidewalls of the gate electrode in the etching of the third film, a second deposition formed on the sidewalls of the gate electrode in the etching of the second film, and a third deposition formed on the sidewalls of the gate electrode in the overetching contain a fluorine atom and do not contain a chlorine atom and a bromine atom, is provided.

Further features of the present invention will become apparent from the following description of exemplary embodiments (with reference to the attached drawings).

BRIEF DESCRIPTION OF THE DRAWINGS

FIGS. 1A to 1C are sectional views for explaining a semiconductor device manufacturing method according to an embodiment of the present invention;

FIG. 3 is a view showing examples of processing gases to be used in etching according to the embodiment of the present invention.

DESCRIPTION OF THE EMBODIMENTS

Figure 2:
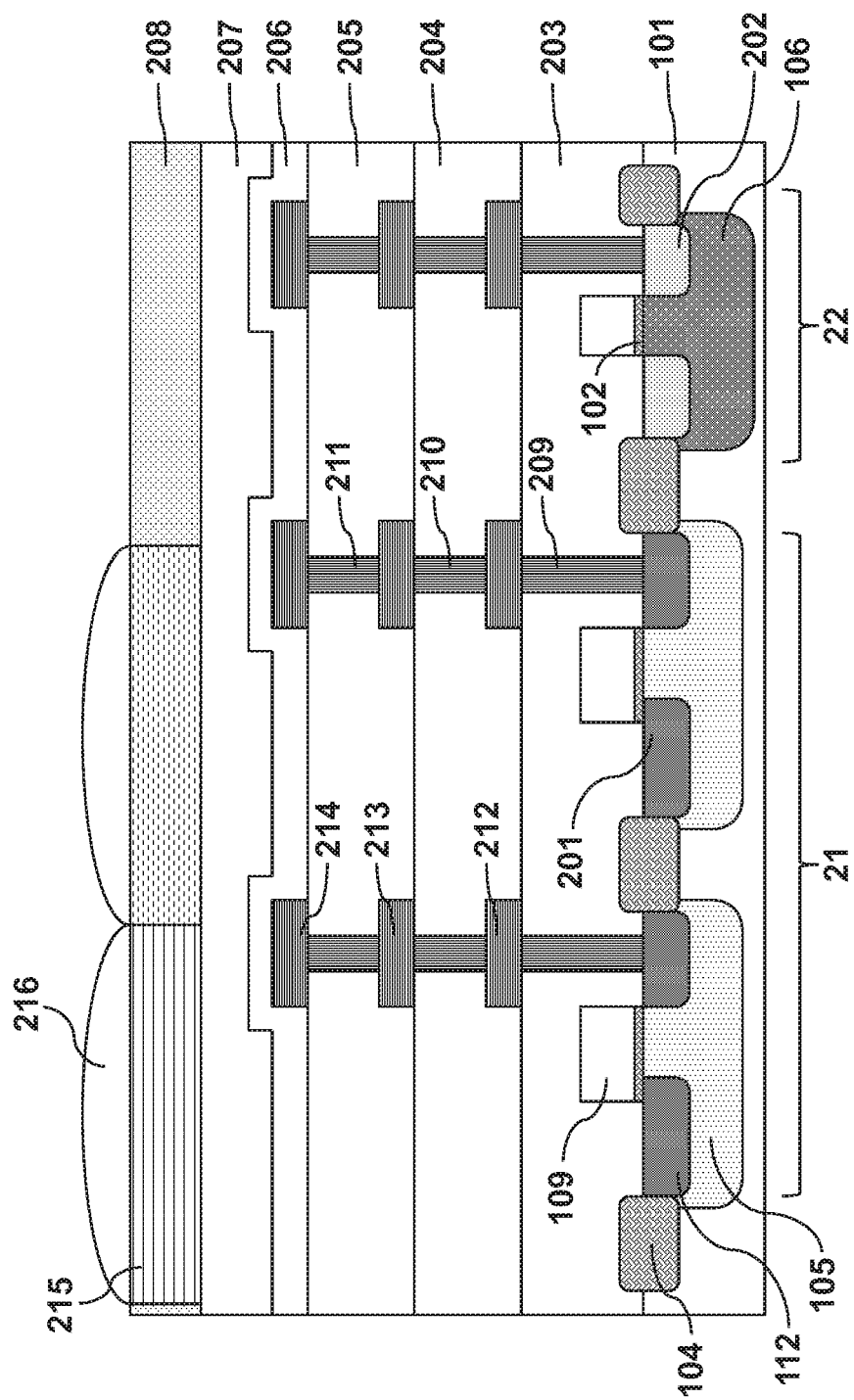
FIG. 2 is a schematic sectional view showing the sectional structure of a CMOS sensor as a solid-state image sensor.

Practical embodiments of a semiconductor device manufacturing method according to the present invention will be explained below with reference to the accompanying drawings. A semiconductor device to be manufactured by the following embodiments is a so-called, front-side illumination solid-state image sensor. However, the present invention is not limited to these embodiments. For example, the present invention is also applicable to a back-side illumination solid-state image sensor. Furthermore, the present invention is applicable not only to a solid-state image sensor but also to other semiconductor devices such as a storage device or an arithmetic processing device.

A solid-state image sensor manufacturing method according to an embodiment of the present invention will be explained below with reference to FIGS. 1A to 1C. A solid-state image sensor manufactured by this method is, for example, a CMOS sensor. In this example shown in FIGS. 1A to 1C, the existing technique can be used as the flow of manufacturing steps of the conventional CMOS sensor well formation method using the CMOS process. Therefore, an explanation thereof will be omitted, and the flow of manufacturing steps from the formation of a gate electrode to the formation of a charge accumulation layer of a photodiode will be explained.

First, a gate insulating film 102 and polysilicon film 103 are deposited in this order on an n-type silicon substrate 101 in which an element isolation portion 104, p-type semiconductor region 105, and n-type semiconductor region 106 are formed. In the p-type semiconductor region 105, a circuit element for forming a pixel region, for example, a photoelectric conversion element or transfer transistor is formed. In the n-type semiconductor region 106, a circuit element for forming a peripheral circuit region, for example, a transistor is formed. Then, an antireflection film 107 is formed on the deposited polysilicon film 103. The antireflection film 107 is formed by an organic material or the like, for example, formed by coating of DUV42P available from NISSAN CHEMICAL INDUSTRIES, LTD. such that the thickness is 0.08 µm. A first mask pattern 108 is formed on the antireflection film 107 by performing coating, exposure, and development of a resist in a photolithography step. For example, this resist is formed by coating of TDUR-P628 available from TOKYO OHKA KOGYO CO., LTD. such that the thickness is 0.8 µm. FIG. 1A is a sectional view after the step of forming the first mask pattern 108. The first mask pattern 108 covers a prospective gate electrode portion of the polysilicon film 103, and does not cover any other portion.

Subsequently, the first mask pattern 108 is used as a mask to etch the polysilicon film 103 through the opening of the first mask pattern 108, thereby forming a gate electrode 109 from the polysilicon film 103. In this etching step, a deposition 110 covering all the surfaces of the sidewalls of the gate electrode 109 is formed on the sidewalls simultaneously with the etching. FIG. 1B is a sectional view after this etching. The deposition 110 may cover all the surfaces of the sidewalls of the etched antireflection film 107, and all the surfaces of the sidewalls of the first mask pattern 108. This etching may also form the gate electrode of another transistor from the polysilicon film 103. Examples of the other transistor are a reset transistor and amplification transistor positioned in the pixel region, and a transistor positioned in the peripheral circuit region.

The etching process for forming the gate electrode 109 includes three etching steps: a first etching step of etching the antireflection film 107; a second etching step of etching the polysilicon film 103; and a third etching step of overetching the polysilicon film 103. First, second, and third processing gases are respectively used in the first, second, and third etching steps.

First, etching of the antireflection film 107 is executed by the endpoint detection method at a pressure of 1.33 Pa or less (10 mTorr or less) by using, for example, a $Cl_2$ gas/$O_2$ gas-based gas. The $Cl_2$ gas/$O_2$ gas-based gas is a gas containing both $Cl_2$ gas and $O_2$ gas as types of gases. The flow rate ratio of the $Cl_2$ gas to the $O_2$ gas is 10:1 or more. This applies to other gases to be explained below. Then, etching of the polysilicon film 103 is performed by the endpoint detection method by using, for example, a $Cl_2$ gas/HBr gas/$O_2$ gas-based gas. Instead, it is also possible to perform etching by using only $Cl_2$ gas at the beginning of etching of the polysilicon film 103, and perform etching by using, for example, the $Cl_2$ gas/HBr gas/$O_2$ gas-based gas after that. The flow rate ratio of the $Cl_2$ gas, HBr gas, and $O_2$ gas is 30:350:15. By thus changing the type of processing gas midway along the process, a structure of the gate electrode 109 can be formed into a vertical shape. It is also possible to change the flow rate of each processing gas, in addition to or instead of changing the type of processing gas. Subsequently, the $Cl_2$ gas/HBr gas/$O_2$ gas-based gas or the like is used in the overetching step as well. In this step, the flow rate ratio of the $Cl_2$ gas, HBr gas, and $O_2$ gas is 5:300:10. FIG. 1B is a sectional view after the etching step of forming the gate electrodes 109.

After that, the first mask pattern 108 is stabilized by ultraviolet irradiation. Then, to form an n-type semiconductor region 112 of a photodiode, a second mask pattern 111 is formed and stabilized by ultraviolet irradiation. In this step, all the surfaces of the sidewalls of the gate electrode 109 are kept covered with the deposition 110. A resist to be used as the second mask pattern 111 is formed by coating of, for example, TDMR-AR65 available from TOKYO OHKA KOGYO CO., LTD. such that the thickness is 1.14 µm. After that, ion implantation is performed through the same opening of the first mask pattern 108 and second mask pattern 111, thereby forming an n-type semiconductor region 112 as a charge accumulation layer of a photodiode in the p-type semiconductor region 105 of the n-type silicon substrate 101. FIG. 1C is a sectional view after the formation of the n-type semiconductor region 112 as a charge accumulation layer.

The position of the n-type semiconductor region 112 is defined by a common portion of the position of the opening of the first mask pattern 108 and the position of the opening of the second mask pattern 111, so the n-type semiconductor region 112 is formed by self alignment in a position adjacent to the gate electrode 109. After the above-mentioned ion implantation, the first mask pattern 108 and second mask pattern 111 left behind to form the n-type semiconductor region 112 of the photodiode are detached.

Then, a multilayer wiring structure is formed on a transfer transistor 21 and peripheral transistor 22. FIG. 2 shows a sectional structure example of a CMOS sensor as the solid-stage image sensor in which the multilayer wiring structure is formed on the semiconductor substrate. In the following example, an n-type silicon substrate 101 on which the gate electrode 109 and n-type semiconductor region 112 are formed by the steps explained with reference to FIG. 1 is used as the semiconductor substrate. In the n-type silicon substrate 101, a p-type semiconductor region 202 which functions as the drain region or source region of the peripheral transistor 22 is further formed. The multilayer wiring structure includes a first insulating film 203 formed on the n-type silicon substrate 101, and a first wiring pattern 212 formed on the first insulating film 203. The first wiring pattern 212, and the n-type semiconductor region 201 and p-type semiconductor region 202 formed in the n-type silicon substrate 101 are connected by a contact plug 209. The multilayer wiring structure also includes a second insulating film 204 formed to cover the first wiring pattern 212, and a second wiring pattern 213 formed on the second insulating film 204. The second wiring pattern 213 is connected to the first wiring pattern 212 by a contact plug 210. The multilayer wiring structure further includes a third insulating film 205 formed to cover the second wiring pattern 213, and a third wiring pattern 214 formed on the second insulating film 205. The third wiring pattern 214 is connected to the second wiring pattern 213 by a contact plug 211. The multilayer wiring structure includes the first, second, and third wiring patterns, the insulating films, and the contact plugs. The first, second, and third insulating films 203, 204, and 205 contain, for example, a silicon oxide film or a material mainly containing a silicon oxide film, and may function as interlayer dielectric films. The first, second, and third wiring patterns 212, 213, and 214 each include a plurality of conductor patterns. These conductor patterns may function as light-shielding films. The first, second, and third wiring patterns 212, 213, and 214 each include a metal film containing Al, Mo, W, Ta, Ti, TiN, Cu, or an alloy mainly containing these metals, or a multilayered film of the metal films. After these metal films are formed on the first, second, or third insulating film 203, 204, or 205, a desired pattern is formed by a photolithography step and dry etching step. The contact plugs 209, 210, and 211 each include a metal film containing Al, Mo, W, Ta, Ti, TiN, Cu, or an alloy mainly containing these metals, or a multilayered film of the metal films. After a desired pattern is formed on the first, second, or third insulating film 203, 204, or 205 by a photolithography step and dry etching step, the contact plugs are formed by burying these metal films. Known manufacturing methods are applicable to these manufacturing methods. A passivation film 206 is formed on this multilayer wiring structure. In addition, a planarization layer 207 is formed on the passivation layer 206, and a color filter layer 215 is formed on the planarization layer 207. Subsequently, microlenses 216 are formed on the color filter layer.

In the above-described example, the processing gases used in the etching of the antireflection film 107, the etching of the polysilicon film 103, and the overetching of the polysilicon film 103 contain chlorine atoms and do not contain fluorine atoms. Since the processing gases containing chlorine atoms are used in all the steps, the first, second, and third depositions formed on the side surfaces of the gate electrode 109 contain a common component. More specifically, the components of the first, second, and third depositions contain chlorine atoms and do not contain fluorine atoms. On the other hand, when a $CF_4$ gas-based gas is used in the etching of the antireflection film 107 and a $Cl_2$ gas/HBr gas-based gas is used in the etching of the polysilicon film 103, the components of depositions formed by these etching steps are different. Detachment readily occurs in the interface between the depositions having the different components. In this embodiment, the processing gases contain the common component, and this makes it possible to avoid discontinuous surfaces of the depositions, and as a consequence suppress detachment of the depositions. This eliminates variations, which are caused by detachment of the depositions on the sidewalls of the gate electrode 109, in n-type ion implantation dose for forming the n-type semiconductor region 112 as the charge accumulation layer of the photodiode. When the n-type ion implantation dose stabilizes, the photodiode characteristic also stabilizes. In addition, when the polysilicon film 103 is overetched, the gate insulating film 102 below the polysilicon film 103 is partially etched. If a $CF_4$ gas-based processing gas is used in the overetching of the polysilicon film 103, the etching amount of the gate insulating film 102 increases, and the n-type ion implantation dose for forming the n-type semiconductor region varies. By using a $Cl_2$ gas/HBr gas-based processing gas in the overetching of the polysilicon film 103, the etching of the gate insulating film 102 is suppressed, and as a consequence the n-type ion implantation dose stabilizes and the photodiode characteristic also stabilizes.

The component common to the processing gases in the etching process for forming the gate electrode 109 is not limited to a chlorine atom as in this embodiment. For example, it is also possible to use combinations of processing gases other than $Cl_2$ gas as shown in FIG. 3. In processing gas example 1, processing gases contain fluorine atoms but do not contain chlorine atoms and bromine atoms in all of the three etching steps. In processing gas example 2, processing gases contain chlorine atoms and bromine atoms but do not contain fluorine atoms in all of the three etching steps. In processing gas example 3, processing gases contain bromine atoms but do not contain fluorine atoms and chlorine atoms in all of the three etching steps. In processing gas example 4, processing gases contain chlorine atoms but do not contain fluorine atoms and bromine atoms in all of the three etching steps. In processing gas example 5, processing gases contain bromine atoms but do not contain fluorine atoms and chlorine atoms in all of the three etching steps. The flow rate ratios of the processing gases are as follows. For example, the flow rate ratio of $Cl_2$ gas, HBr gas, and $O_2$ gas in processing gas example 2 is 30:350:15. In processing gas example 3, the flow rate ratio of HBr gas and $O_2$ gas is 300:10, and that of HBr gas, $O_2$ gas, and He gas is 300:10:10. The flow rate ratio of $Cl_2$ gas and $O_2$ gas in processing gas example 4 is 10:1, and that of HBr gas and $O_2$ gas in processing gas example 5 is 300:10.

Since the processing gases have the common component in all of the three etching steps, the first, second, and third depositions formed on the side surfaces of the gate electrode 109 also contain the common component. For example, in processing gas example 1, the depositions contain fluorine atoms but do not contain chlorine atoms and bromine atoms. In processing gas example 2, the depositions contain chlorine atoms and bromine atoms but do not contain fluorine atoms. In processing gas example 3, the depositions contain bromine atoms but do not contain fluorine atoms and chlorine atoms. In processing gas example 4, the depositions contain chlorine atoms but do not contain fluorine atoms and bromine atoms. In processing gas example 5, the depositions contain bromine atoms but do not contain fluorine atoms and chlorine atoms.

Furthermore, instead of using the processing gases containing the common component, the same processing gas may also be used in these etching steps. "The same processing gas" herein mentioned means that the types of gases forming processing gases are the same. For example, in process gas examples 1, 2, 4, and 5, the same processing gas is used in all of the three etching processes. More specifically, in processing gas example 1, $CF_4$ gas containing fluorine is used as all the processing gases for use in the three etching processes.

In addition, although not shown in FIG. 3, it is also possible to use the same processing gas in the etching of the antireflection film 107 and the etching of the polysilicon film 103, and a different processing gas in the overetching of the polysilicon film 103. Also, as in this embodiment or in processing gas example 3, it is possible to use the same processing gas in the etching of the polysilicon film 103 and the overetching of the polysilicon film 103, and a different processing gas in the etching of the antireflection film 107.

In this embodiment, the antireflection film 107 made of an organic material is the film formed on the polysilicon film 103. However, the antireflection film 107 made of an inorganic material may also be used. In addition, the film formed on the polysilicon film 103 need not be an antireflection film and may also be a hard mask insulating film made of an inorganic material. Furthermore, it is also possible to form a hard mask insulating film made of an inorganic material and an antireflection insulating film made of an organic material on the polysilicon film.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-130686, filed Jun. 25, 2014 which is hereby incorporated by reference wherein in its entirety.

What is claimed is:

1. A semiconductor device manufacturing method comprising:
    forming a first film, a second film, and a third film in this order on a semiconductor substrate;
    forming a first mask pattern on the third film;
    forming a gate electrode by using the first mask pattern;
    forming a second mask pattern having an opening above a portion of the first mask pattern and a region adjacent to the gate electrode; and
    performing ion implantation on the semiconductor substrate by using the first mask pattern and the second mask pattern as masks,
    wherein forming the gate electrode includes etching the third film by using a first processing gas, etching the second film by using a second processing gas, and overetching the second film by using a third processing gas, and a first deposition formed on sidewalls of the gate electrode in the etching of the third film, a second deposition formed on the sidewalls of the gate electrode in the etching of the second film, and a third deposition formed on the sidewalls of the gate electrode in the overetching contain at least one of a chlorine atom or a bromine atom and do not contain a fluorine atom.

2. The method according to claim 1, wherein the first deposition, the second deposition, and the third deposition contain a chlorine atom.

3. The method according to claim 1, wherein the first processing gas, the second processing gas, and the third processing gas contain a gas containing at least one of a chlorine atom or a bromine atom, and do not contain a gas containing a fluorine atom.

4. The method according to claim 2, wherein the first processing gas, the second processing gas, and the third processing gas contain a gas containing a chlorine atom.

5. The method according to claim 3, wherein the gas containing a chlorine atom is $Cl_2$ gas.

6. The method according to claim 3, wherein the gas containing a bromine atom is HBr gas.

7. The method according to claim 1, wherein at least one of the first processing gas, the second processing gas, or the third processing gas contains $O_2$ gas.

8. The method according to claim 1, wherein the first processing gas contains $O_2$ gas.

9. The method according to claim 1, wherein the etching of the third film is performed at a pressure of not more than 1.33 Pa.

10. The method according to claim 1, wherein in the etching of the second film, the second processing gas contains only $Cl_2$ gas at the start of etching, and contains $Cl_2$ gas and a gas other than $Cl_2$ gas thereafter.

11. The method according to claim 1, wherein the first processing gas and the second processing gas are the same processing gas.

12. The method according to claim 1, wherein the second processing gas and the third processing gas are the same processing gas.

13. The method according to claim 1, wherein the first processing gas, the second processing gas, and the third processing gas are the same processing gas.

14. The method according to claim 1, wherein the semiconductor device is a solid-state image sensor.

15. The method according to claim 1, wherein the first film is a gate insulating film, the second film is a polysilicon film, and the third film is made of an organic material.

16. The method according to claim 1, wherein
the semiconductor device comprises a photoelectric conversion element, and a transfer transistor which transfers electric charge stored in the photoelectric conversion element,
the gate electrode is a gate electrode of the transfer transistor, and
a semiconductor region forming a part of the photoelectric conversion element is formed in the performing of ion implantation.

17. A semiconductor device manufacturing method comprising:
forming a first film, a second film, and a third film in this order on a semiconductor substrate;
forming a first mask pattern on the third film;
forming a gate electrode by using the first mask pattern;
forming a second mask pattern having an opening above a portion of the first mask pattern and a region adjacent to the gate electrode; and
performing ion implantation on the semiconductor substrate by using the first mask pattern and the second mask pattern as masks,
wherein forming the gate electrode includes etching the third film by using a first processing gas, etching the second film by using a second processing gas, and overetching the second film by using a third processing gas, and
a first deposition formed on sidewalls of the gate electrode in the etching of the third film, a second deposition formed on the sidewalls of the gate electrode in the etching of the second film, and a third deposition formed on the sidewalls of the gate electrode in the overetching contain a fluorine atom and do not contain a chlorine atom and a bromine atom.

18. The method according to claim 17, wherein the first processing gas, the second processing gas, and the third processing gas contain a gas containing fluorine and do not contain a gas containing chlorine and bromine.

19. The method according to claim 17, wherein the first film is a gate insulating film, the second film is a polysilicon film, and the third film is made of an organic material.

20. The method according to claim 17, wherein
the semiconductor device comprises a photoelectric conversion element, and a transfer transistor which transfers electric charge stored in the photoelectric conversion element,
the gate electrode is a gate electrode of the transfer transistor, and
a semiconductor region forming a part of the photoelectric conversion element is formed in the performing of ion implantation.

* * * * *